United States Patent [19]
Kim

[11] Patent Number: 5,386,425
[45] Date of Patent: Jan. 31, 1995

[54] TWO-DIMENSIONAL ERROR CORRECTING METHOD AND DECODER

[75] Inventor: Tae-eung Kim, Suwon, Rep. of Korea

[73] Assignee: Samsung Electronics Co., Ltd., Kyungki-Do, Rep. of Korea

[21] Appl. No.: 38,638

[22] Filed: Mar. 29, 1993

[30] Foreign Application Priority Data

Aug. 13, 1992 [KR] Rep. of Korea ............ 92-14568

[51] Int. Cl.$^6$ ............................................. G06F 11/10
[52] U.S. Cl. .................................................. 371/37.4
[58] Field of Search ............... 371/37.4, 37.5, 37.7, 371/41, 49.1–49.4, 50.1

[56] References Cited

U.S. PATENT DOCUMENTS

| | | | |
|---|---|---|---|
| 4,336,612 | 6/1982 | Inoue et al. | 371/37.4 |
| 4,884,273 | 11/1989 | Caprasse | 371/49.4 |
| 5,181,207 | 1/1993 | Chapman | 371/37.4 |

*Primary Examiner*—Joseph Ruggiero
*Attorney, Agent, or Firm*—Sughrue, Mion, Zinn, Macpeak & Seas

[57] ABSTRACT

A method carries out outer parity coding with respect to block identification data ID in a two-dimensional error correction method for adding an outer parity OP1 with respect to subblock data in the vertical direction and adding an inner parity IP with respect to either block identification data ID and subblock data or the block identification data ID and outer parity in the horizontal direction. Here, utilizing the recurrent pattern of the block identification data ID, the outer parity OP2 with respect to the block identification data ID is predictive-coded, and the outer parity decoding is performed along with the result of the predictive coding. Thus, the error correction effect with respect to the block identification data ID can be improved.

5 Claims, 4 Drawing Sheets

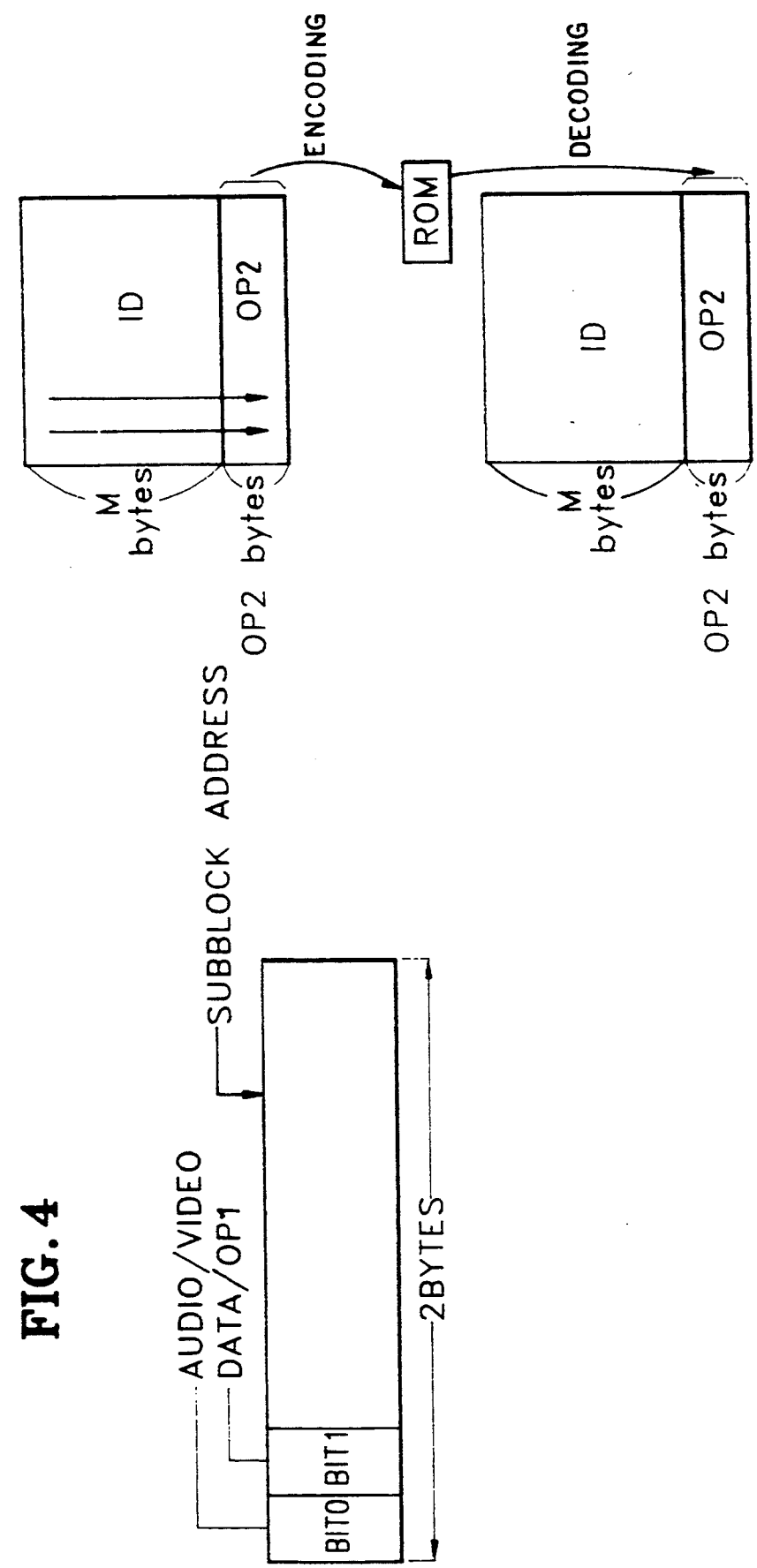

TWO-DIMENSIONAL ERROR CORRECTING METHOD AND DECODER

BACKGROUND OF THE INVENTION

The present invention relates to a two-dimensional error correction method using an outer parity added with respect to subblock data in the vertical direction, and an inner parity added with respect to either block identification data and subblock data or block identification data and the outer parity in the horizontal direction, and more particularly to a two-dimensional error correction method capable of outer parity decoding with respect to the block identification data, and a decoder suitable for utilizing the same.

A two-dimensional error correction method is an error correction method for securing data integrity, which is transmitted in a block-unit having a plurality of subblocks. Such a two-dimensional error correction method utilizes two types of error correction codes, one of which is related to a subblock (one-dimensional error correction code) and the other being related to a block (two-dimensional error correction code). Thus, a single error which occasionally will appear within any subblock (random errors) can be corrected by an error correction code in the one-dimensional level (relating to the subblocks), and successive errors of two or more subblocks (burst errors) can be corrected in the two-dimensional level (relating to the block).

A one-dimensional error correction code is produced by measuring either a subblock having block identification data ID and the subblock data, or a subblock having block identification data ID and a two-dimensional error correction code, which is then included in each subblock. A two-dimensional error correction code is produced by evaluating a byte-column formed of bytes in the same order within the subblock.

In the two-dimensional error correction method, the data has both one-dimensional and two-dimensional correction codes, while the block identification data ID has a one-dimensional error correction code only. As transmitted data maintains integrity with respect to random errors and burst errors by means of two error correction codes, it becomes preferable that the block identification data ID also has both error correction codes.

SUMMARY OF THE INVENTION

Accordingly, it is an object of the present invention to provide a two-dimensional error correction method capable of enhancing an error correction effect with respect to block identification data ID.

It is another object of the present invention to provide a decoder suitable for utilizing the two-dimensional error correction method.

To achieve one object of the present invention, there is provided a two-dimensional error correction method comprising a coding step of adding an outer parity OP1 with respect to subblock data in the vertical direction and adding an inner parity IP with respect to either block identification data ID and subblock data or the block identification data ID and outer parity OP1 in the horizontal direction, and a decoding step for the subblock data by means of both the outer parity OP1 and inner parity IP, and for the block identification data ID by means of the inner parity IP, the two-dimensional error correction method further comprising the steps of:

storing a predictive-coded error correcting outer parity OP2 according to the recurrent a pattern of the block identification data ID; and performing error correction during decoding the block identification data ID, using the stored error correcting outer parity OP2.

To achieve another object of the present invention, there is provided a decoder for decoding block data having an outer parity OP1 and block identification data ID added with respect to subblock data in the vertical direction, and an inner parity IP added to either the subblock data or the block identification data ID and the outer parity OP1 in the horizontal direction, wherein the decoder includes an inner parity decoder for decoding either the block identification data ID and subblock data or the block identification data ID and outer parity OP1 by means of the inner parity IP, and a first outer parity decoder connected to the inner party decoder for decoding the subblock data by means of the outer parity OP1 in the vertical direction, the decoder further comprising:

a ROM for storing an predictive-coded outer parity OP2 according to the recurrent pattern of the block identification data ID; and a second outer parity decoder connected in parallel with the first outer parity decoder, for performing outer parity decoding of the block identification data ID by means of the predictive-coded outer parity OP2 stored in the ROM.

BRIEF DESCRIPTION OF THE DRAWINGS

The above objects and other advantages of the present invention will become more apparent by describing in detail a preferred embodiment thereof with reference to the attached drawings in which:

FIG. 4 shows a data format of block identification data;

FIG. 5 shows an error correction method according to the present invention;

DETAILED DESCRIPTION OF PREFERRED EMBODIMENTS

Figure 1:
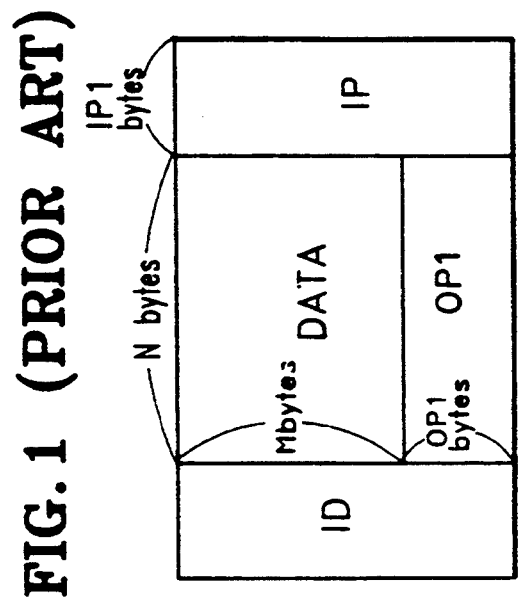
FIG. 1 is a view showing a conventional two-dimensional error correction method.

In FIG. 1, it is assumed that data to be transmitted is written in a memory as a matrix of N×M bytes. Here, the N bytes (in the row direction) correspond to the length of the data which will be included in a subblock, and the M bytes (in the column direction) correspond to a number of subblocks having the data which will be included in a block.

In the two-dimensional error correction method, an outer parity OP1 having a length of OP1 bytes is added with respect to the M-byte column of the data written in the memory, Then, block identification data ID is added for the subblock including the data or outer parity OP1. Generally, the block identification data ID includes one bit for distinguishing audio and video data, another bit for distinguishing data and outer parity OP1, a subblock address, etc. Finally, an inner parity IP having the length of IP1 bytes is added with respect to either block identification data ID and data of subblock or the block identification data ID and outer parity OP1.

Figure 2:
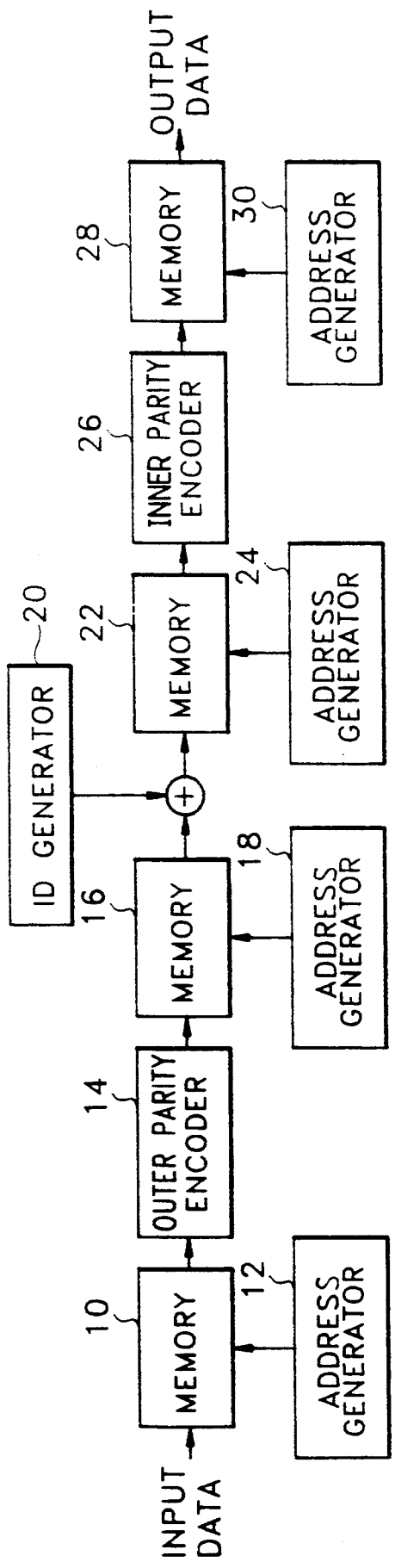
FIG. 2 is a block diagram showing an encoder suitable for the conventional two-dimensional error-correction method.

FIG. 2 is a block diagram showing an encoder suitable for a two-dimensional error correction method. Here, reference numerals 10 and 12 designate a first memory and a first address generator, which output re-arranged data for performing outer parity coding; 14 is an outer parity encoder; 16 and 18 are a second memory and a second address generator, which write the result of the outer parity coding from outer parity encoder 14, and output the re-arranged data in a subblock unit; 20 is a block identification data ID generator for adding the block identification data ID to each subblock; 22 and 24 are a third memory and a third address generator, which output the re-arranged subblock to which the block identification data ID is added, for performing inner parity coding; 26 is an inner parity encoder; and 28 and 30 are a fourth memory and a fourth address generator, which write the result of the inner parity coding and output the result in the subblock unit.

The operation of each portion shown in FIG. 2 will be described with reference to FIGS. 3A through 3E. Data input to the encoder shown in FIG. 2 has a block structure consisting of a plurality of subblocks. The data may be video/audio data which is conversion-coded and then variable-length-coded in, for example, digital video tape recorders, high-definition televisions, video disk players, etc.

Figure 3A:
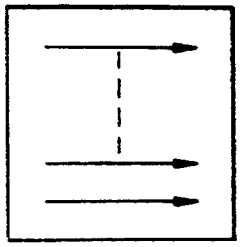
FIGS. 3A through 3E show data formats written in and/or read out from each memory in the encoder shown in FIG. 2.
Figure 3B:
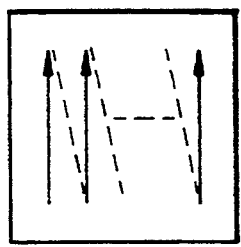
Figure 3C:
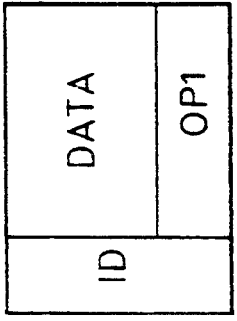

The input data is written in first memory 10 according to the form shown in FIG. 3A, under the control of first address generator 12. Here, it is assumed that the length of the data included in each subblock is N bytes, and a number of subblocks having data included in each block is M. The data written in first memory 10 is read out as shown in FIG. 3B by first address generator 12 and then transmitted to outer parity encoder 14. In other words, the byte-column input to outer parity encoder 14 is composed of an M-byte column formed by reading out bytes in the same order among the data included in each subblock, i.e., the sequence of read out in successive column of M-bytes each. Outer parity encoder 14 evaluates each input byte-column, and forms an outer parity OP1 having a length of OP1 bytes for each such column, and then adds the outer parity OP1 to the input byte-column. The column of M data bytes plus OPI parity bytes is thereby transmitted to second memory 16. Second address generator 18 controls the read/write operations of second memory 16. FIG. 3C shows the format of data and outer parity OP1 written in the second memory 16. The data and outer parity OP1 written in second memory 16 is read out in an N-byte subblock unit (i.e., one row at a time) by second address generator 18. Each such row of N bytes of data or outer parity OP1 has added thereto the block identification data ID produced from ID generator 20, and the combination of block identification data ID and N bytes of data or outer parity OP1 is entered row by row into the third memory 22. There are two types of the subblock outputs from second memory 16; one having the data and the other having the outer parity OP1.

The block identification data ID includes one bit for distinguishing audio and video data, another bit for distinguishing data and outer parity OP1, a subblock address, etc.

Figure 3D:
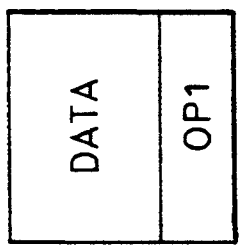

The third address generator 24 controls the read/write operations of third memory 22. FIG. 3D shows the data, outer parity, and added block identification data ID in the third memory 22. The third address generator 24 reads out the subblocks having the block identification data ID and data or having the block identification data ID and outer parity OP1, and then transmits this information on a row by row basis to the inner parity encoder 26. Inner parity encoder 26 evaluates the input subblock to form an inner parity IP having the length of IP1 bytes which is in turn added to the input subblock, and then transmits the subblock having the inner parity IP to fourth memory 28.

Figure 3E:
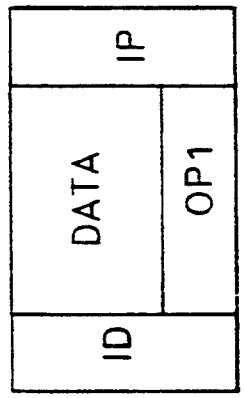

Fourth address generator 30 controls the read/write operations of fourth memory 28. FIG. 3E shows the format written in fourth memory 28. Fourth address generator 30 reads out either a subblock having the block identification data ID, data and inner parity IP, or a subblock having block identification data ID, outer parity OP1 and inner parity IP, and then outputs the read-out subblock.

In the two-dimensional error correction encoder shown in FIG. 2, the data has both inner and outer parities IP and OP1, but the block identification data ID has inner parity IP only. As the integrity of the transmitted data with respect to random errors and burst errors can be maintained by means of a dual-type error correction code, it becomes preferable that the block identification data ID also has a dual-type error correction code.

FIG. 4 shows the data format of the block identification data ID. The block identification data ID generally includes one bit for designating audio or video data, another bit for designating data or outer parity OP1, a subblock address, etc. In transmitting data of block-units, a constant number of subblocks is produced, and an individual block identification data ID is added to each subblock. In the block identification data ID, the subblock address has a pattern which is increased sequentially and recursively. Also, since the audio and video data and the data and outer parity OP1 occupy fixed areas in regular order within the block structure, the block identification data ID with respect to all subblocks can be predicted. And, the outer parity with respect to the block identification data ID can be predictive-coded.

In the present invention, by using these characteristics, the outer parity with respect to the block identification data ID is predictive-coded, so that decoding is carried out.

FIG. 5 shows an error correction method according to the present invention. During a coding step, the byte-column of M bytes along the same order in each block identification data ID is evaluated to thereby form a predictive-coded outer parity having a length of OP2 bytes. The outer parity OP2 with respect to the block identification data ID is stored in a storage unit e.g., a ROM(Read Only Memory) of a decoder corresponding to an encoder. During decoding step, the block identification data ID is decoded by means of the outer parity OP2 written in the storage unit.

Figure 6:
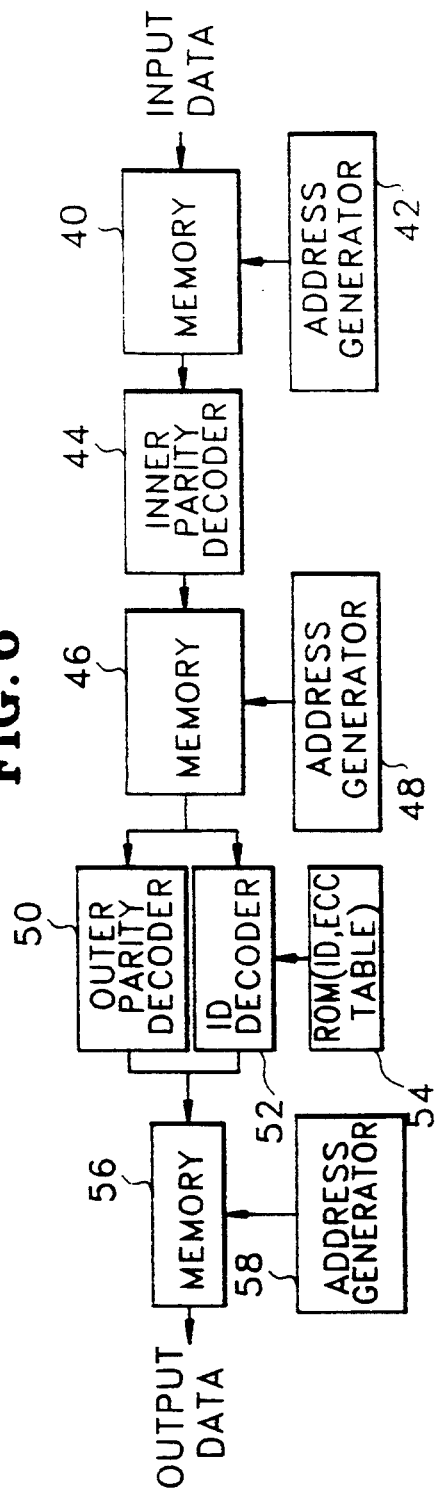
FIG. 6 is a block diagram showing one embodiment of a decoder suitable for using the error correction method according to the present invention.

FIG. 6 is a block diagram showing one embodiment of a decoder suitable for error correction according to the present invention. Here, reference numerals 40 and 42 designate a fifth memory and a fifth address generator, which output the re-arranged subblock from fourth memory 28 shown in FIG. 3 to perform inner parity decoding; 44 is an inner parity decoder; 46 and 48 are sixth memory and a sixth address generator, which output re-arranged data to perform outer parity decoding of the inner parity decoded data; 50 is an outer parity decoder with respect to the data; 52 is an outer parity decoder with respect to the block identification data ID; 54 is a read only memory (ROM) which stores the predictive-coded outer parity OP2 with respect to the block identification data ID; and 56 and 58 are a seventh memory and a seventh address generator, for re-arranging and outputting the data and block identification data ID which are decoded by means of a two-dimensional error correction code.

Figure 7A:
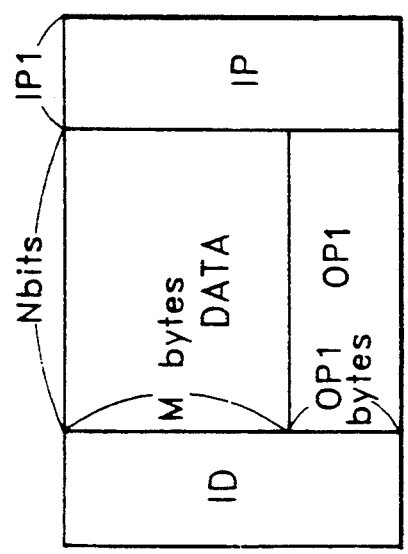
FIGS. 7A, 7B and 7C show data formats written in and/or read out from respective memories in the decoder shown in FIG. 6.

The operation of the decoder shown in FIG. 6 will be described with reference to FIGS. 7A, 7B and 7C.

Here, the subblock output from fourth memory 28 shown in FIG. 3 is input to the decoder shown in FIG. 6. Fifth address generator 42 controls the read/write operations of fifth memory 40. The subblock input to fifth memory 40 is written in the pattern as shown in FIG. 7A, under the control of fifth address generator 42. The subblock read out from fifth memory 40 is transmitted to inner parity decoder 44. Inner parity decoder 44 carries out the inner parity decoding with respect to the combination of either block identification data ID and data or block identification data ID and outer parity OP1, using the inner parity IP included in the subblock input to inner parity decoder 44, and transmits the result to sixth memory 46. Sixth address generator 48 controls the read/write operations of sixth memory 46. The format of the data written in sixth memory 46 is illustrated in FIG. 7B.

Figure 7B:
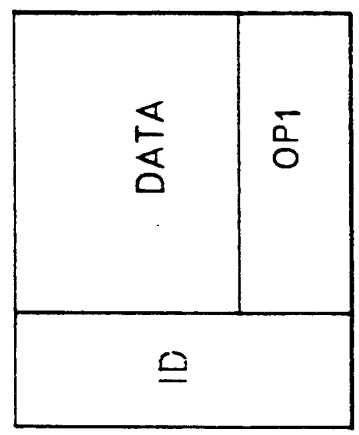
Figure 7C:
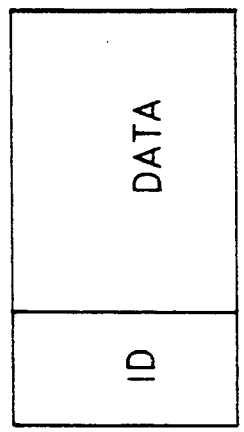

The data written in sixth memory 46 is read out by sixth address generator 48 as illustrated in FIG. 7B, and then transmitted to outer parity decoder 50. That is, the byte-column input to outer parity decoder 50 is formed in such a manner that the bytes in the same order in the data included in each subblock are read out to thereby form a byte-column of M+OP1 bytes. Outer parity decoder 50 decodes the byte-column of M bytes by means of the outer parity OP1 having the length of OP1 bytes, and transmits the decoded result to seventh memory 56.

Meanwhile, the byte-column of M+OP1 bytes formed by reading out the bytes in the same order among the block identification data ID included in the subblock in sixth memory 46 is transmitted to ID decoder 52. ROM 54 stores the predictive-coded outer parity OP2 with respect to the block identification data ID: ID decoder 52 reads out the outer parity OP2 corresponding to the sequentially input byte-column from ROM 54, and performs the outer parity decoding with respect to the block identification data ID, using the read-out outer parity OP2. Then, the result of the decoding is transmitted to seventh memory 56.

Seventh address generator 58 controls the read/write operations of seventh memory 56. The format of data written in seventh memory 56 is shown in FIG. 7C. Seventh memory 56 reads out and outputs the block identification data ID and data in a subblock unit.

In the two-dimensional error correction method according to the present invention as described above, the predictive coding of the outer parity OP2 with respect to the block identification data ID is performed by utilizing the recurrent pattern of the block identification data ID, so that the outer parity decoding is carried out along with the result of the predictive coding. Therefore, the error correction effect of a two-dimensional error correction system is improved.

The decoder according to the present invention stores the predictive-coded outer parity OP2 in accordance with the recurrent pattern of the block identification data ID in a ROM. Then, referring to the ROM, the outer parity decoding with respect to block identification data ID is performed, so that additional outer parity with respect to the block identification data ID is not needed during coding. As a result, the number of bits output from the encoder can be decreased.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A two-dimensional error correction method comprising a coding step of adding an outer parity OP1 with respect to data of subblock in the vertical direction and adding an inner parity IP with respect to block identification data ID and subblock data and then said block identification data ID and outer parity OP1 in the horizontal direction, and a decoding step for said subblock data by means of both said outer parity OP1 and inner parity IP and for said block identification data ID by means of said inner parity IP, said two-dimensional error correction method further comprising the steps of:

storing a predictive-coded error correcting outer parity OP2 according to a recurrent pattern of said block identification data ID; and performing error correction during decoding of said block identification data ID, using said stored error correcting outer parity OP2.

2. In a two dimensional error correction method of the type having;

a coding step for coding a block of data with vertical and horizontal dimensions, wherein each vertical data of subblock has outer parity added thereto, each horizontal subblock of data and outer parity has ID of a recurrent pattern added thereto, and each horizontal subblock of ID and data and each horizontal subblock of ID and outer parity has inner parity added thereto; and a decoding step for said latter encoded data, wherein subblocks of horizontal data and ID are error corrected based on an associated inner parity, and subblocks of inner parity corrected vertical data are error corrected based on an associated outer parity;

the improvement comprising:

storing error correcting outer parity bytes, predicted according to the recurrent pattern of said block identification data; and performing error correction on said block identification data, during said decoding step, by using stored said error correcting outer parity.

3. In a decoder for decoding block data having outer parity OP1 added with respect to subblock data in the vertical direction, and inner parity IP added to a block identification data ID and subblock data and then to said block identification data ID and said outer parity OP1 in the horizontal direction, said decoder including an inner parity decoder for decoding combinations of said block identification data ID and subblock data and said block identification data ID and outer parity OP1 by means of said inner parity IP, and a first outer parity decoder connected to said inner parity decoder for decoding said subblock data by means of said outer parity OP1, said decoder further comprising:

a ROM for storing a predictive-coded outer parity OP2 according to a recurrent pattern of said block identification data ID; and a second outer parity decoder connected in parallel with said first outer parity decoder, for performing outer parity decoding of said block identification data ID by means of said predictive-coded outer parity OP2 stored in said ROM.

4. A decoder for decoding block data with identification data (ID) and parity bytes according to the following format:

data is arranged to have a horizontal and vertical dimension; outer parity bytes are provided for each vertical column of data; identification data (ID) is provided for each row of horizontal data and for each row of outer parity bytes; and inner parity is provided for each row of ID plus data and for each row of ID plus outer parity;

said decoder comprising:

an inner parity decoder for error correcting said block data with ID and inner and outer parity in accordance with the inner parity bytes to provide at an output thereof inner parity decoded block data, ID and outer parity bytes;

an outer parity decoder for error correcting said block data output from said inner parity decoder in accordance with said outer parity bytes, to provide at an output thereof inner and outer parity decoded block data;

a ROM having stored therein predictive coded outer parity bytes predicted according to a re-current pattern of said block identification data; and an ID parity decoder connected in parallel with said outer parity decoder for error correcting said block identification data output from said inner parity decoder in accordance with said predictive coded outer parity bytes to output inner and outer parity corrected ID.

5. A two-dimensional error correction method for digital information having a rectangular array of bits including N bytes in the horizontal direction and M bytes in the vertical direction, where N and M are integers greater than 1, said method comprising:

a coding step including the sub-steps of:

adding an outer parity OP1 having OP1 bytes to respective said M bytes in the vertical direction so as to form a rectangular array of $N \times (M+OP1)$ bytes;

adding an identification data ID having ID bytes so as to form a rectangular array of $((ID+N) \times (M+OP1))$ bytes; and adding an inner parity IP having IP bytes to respective $(ID+N)$ bytes so as to form a rectangular array of $((ID+N+IP) \times (M+OP1))$ bytes; and a decoding step including the sub-steps of:

correcting said rectangular array of $(ID+N) \times (M+OP1)$ bytes by means of said inner parity IP; and correcting said $(N \times M)$-byte rectangular array means of said outer parity OP1;

wherein said two-dimensional error correction method further comprises the steps of:

generating an outer parity OP2 having OP2 bytes and supplying said outer parity OP2 to said identification data ID with respect to the vertical direction and storing said outer parity OP2 to a ROM in said coding step; and correcting said identification data ID by means of said outer parity OP2 stored in said ROM in said decoding step.

* * * * *